(12) United States Patent
Lin et al.

(10) Patent No.: US 12,309,986 B2
(45) Date of Patent: May 20, 2025

(54) SURGE PROTECTION MODULE

(71) Applicant: CYBER POWER SYSTEMS, INC., Taipei (TW)

(72) Inventors: Ho-Hsien Lin, Taipei (TW); Shu-Yi Liao, Taipei (TW); Chih-Heng Lin, Taipei (TW)

(73) Assignee: CYBER POWER SYSTEMS, INC., Taipei (TW)

( * ) Notice: Subject to any disclaimer, the term of this patent is extended or adjusted under 35 U.S.C. 154(b) by 149 days.

(21) Appl. No.: 18/297,840

(22) Filed: Apr. 10, 2023

(65) Prior Publication Data

US 2024/0306355 A1  Sep. 12, 2024

(30) Foreign Application Priority Data

Mar. 6, 2023  (CN) .......................... 202320398697.7

(51) Int. Cl.
*H05K 1/02* (2006.01)
*H05K 9/00* (2006.01)

(52) U.S. Cl.
CPC .............. *H05K 9/0067* (2013.01); *H05K 1/02* (2013.01); *H05K 1/0259* (2013.01); *H05K 2201/012* (2013.01); *H05K 2201/073* (2013.01)

(58) Field of Classification Search
CPC .......... H05K 9/00; H05K 1/02; H05K 9/0067; H05K 1/0259; H05K 2201/012; H05K 2201/073; H02H 9/00

USPC .................................................. 361/117–120
See application file for complete search history.

(56) References Cited

U.S. PATENT DOCUMENTS

| | | | | |
|---|---|---|---|---|
| 5,187,634 A | * | 2/1993 | Pitsch | H01T 1/14 361/120 |
| 5,539,801 A | * | 7/1996 | Herh | H04M 1/745 379/1.01 |
| 10,027,108 B2 | * | 7/2018 | Peach | H02H 3/048 |
| 2007/0058318 A1 | * | 3/2007 | Jong | H01T 4/06 361/119 |
| 2007/0236849 A1 | * | 10/2007 | Bono | H01H 85/44 361/104 |
| 2015/0263442 A1 | * | 9/2015 | Bakatsias | H01R 12/75 439/78 |

* cited by examiner

*Primary Examiner* — Danny Nguyen
(74) *Attorney, Agent, or Firm* — BACON&THOMAS, PLLC

(57) ABSTRACT

A surge protection module comprises an upper cover, a lower cover, a printed circuit board assembly (PCBA) and a flame-retardant filler. The lower cover is configured for connecting with the upper cover, and for forming an accommodation space together with the upper cover. At least one through hole is formed at the junction of the lower cover and the upper cover. The PCBA has a plurality of copper traces, and is equipped with at least one surge protection device (SPD). The PCBA further has a plurality of welding structures, and the welding structures are electrically coupled to the SPDs through the copper traces. The PCBA is disposed in the accommodation space, and a part of the PCBA passes through the at least one through hole for exposing the welding structures. The flame-retardant filler is filled in the gap of the accommodation space.

13 Claims, 15 Drawing Sheets

SURGE PROTECTION MODULE

BACKGROUND OF THE INVENTION

Field of the Invention

The present invention relates to the technology of surge protection, and more particularly, to a surge protection module.

Description of Related Art

Surge protection devices (SPDs), such as metal oxide varistors (MOVs), gas discharge tubes (GDTs) and transient voltage suppressors (TVSs), etc., are often equipped in an electronic device for protecting the electronic device when a surge current occurs.

However, when a surge protection device absorbs the surge current excessively, it may catch fire, burn, or even explode, and then the user of the electronic device may suffer catastrophic consequences.

SUMMARY OF THE INVENTION

An object of the present invention is to provide a fireproof/explosion-proof surge protection module containing a surge protection device, an electronic device adopting the surge protection module can reduce the potential risk of disaster caused by the fire or explosion of the surge protection device.

To achieve the above object, the present invention provides a surge protection module, which comprises an upper cover, a lower cover, a printed circuit board assembly (PCBA) and a flame-retardant filler. The lower cover is configured for connecting with the upper cover, and for forming an accommodation space together with the upper cover. At least one through hole is formed at the junction of the lower cover and the upper cover. The PCBA has a plurality of copper traces, and is equipped with at least one surge protection device (SPD). The PCBA further has a plurality of welding structures, and the welding structures are electrically coupled to the SPDs through the copper traces. The PCBA is disposed in the accommodation space, and a part of the PCBA passes through the at least one through hole for exposing the welding structures. The flame-retardant filler is filled in the gap of the accommodation space.

In order to make the above objects, technical features and gains after actual implementation more obvious and easy to understand, in the following, the preferred embodiments will be described with reference to the corresponding drawings and will be described in more detail.

BRIEF DESCRIPTION OF THE DRAWINGS

Other features and advantages of the present invention will become apparent in the following detailed description of the preferred embodiments with reference to the accompanying drawings, of which.

DESCRIPTION OF EMBODIMENTS

The characteristics, contents, advantages and achieved effects of the present disclosure will become more fully understood from the detailed description given herein below and the accompanying drawings which are given by way of illustration only, and thus are not limitative of the present disclosure.

As required, detailed embodiments are disclosed herein. It must be understood that the disclosed embodiments are merely exemplary of and may be embodied in various and alternative forms, and combinations thereof. As used herein, the word "exemplary" is used expansively to refer to embodiments that serve as illustrations, specimens, models, or patterns. The figures are not necessarily to scale and some features may be exaggerated or minimized to show details of particular components. In other instances, well-known components, systems, materials, or methods that are known to those having ordinary skill in the art have not been described in detail in order to avoid obscuring the present disclosure. Therefore, specific structural and functional details disclosed herein are not to be interpreted as limiting, but merely as a basis for the claims and as a representative basis for teaching one skilled in the art.

Figure 1:
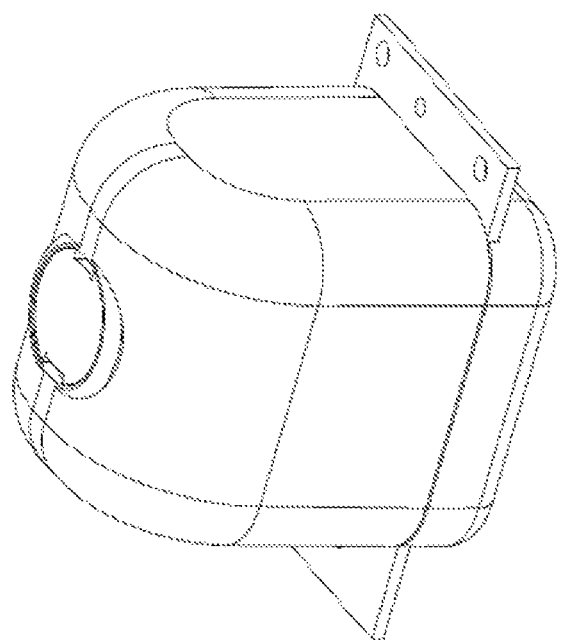
FIG. 1 shows one angle of view of a surge protection module 100 according to an embodiment of the present invention.
Figure 2:
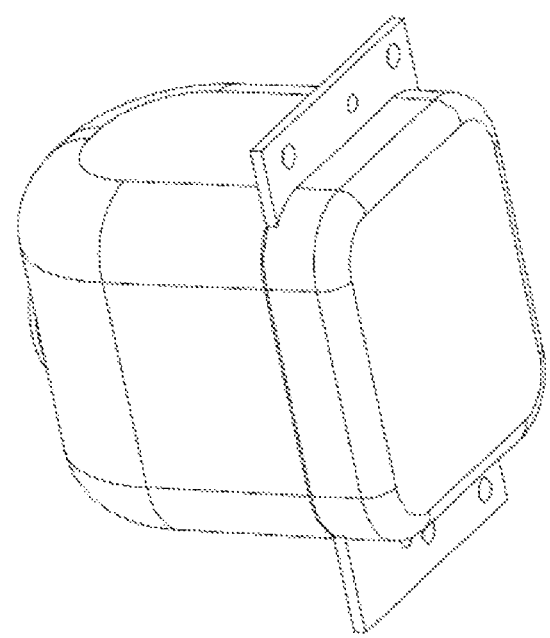
FIG. 2 shows another angle of view of the surge protection module 100.
Figure 3:
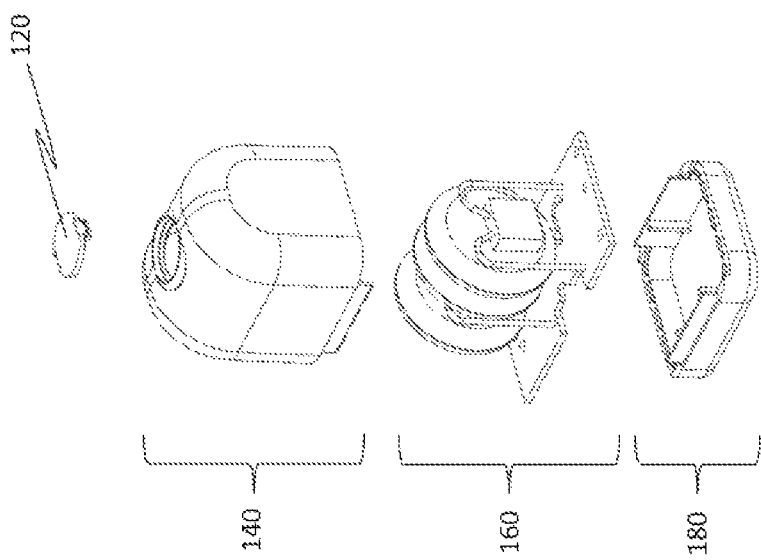
FIG. 3 shows one angle of view of an exploded view of the surge protection module 100.
Figure 4:
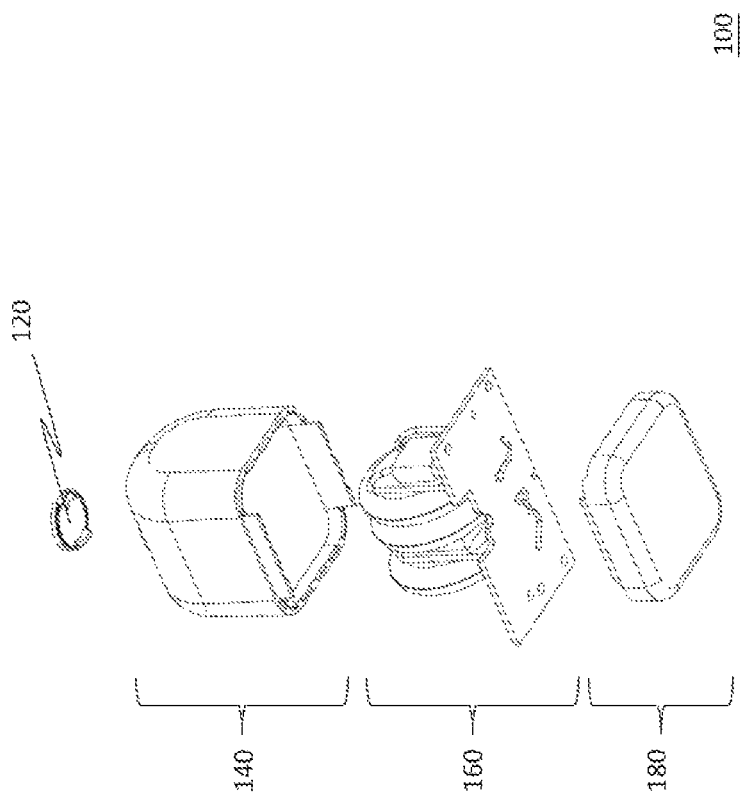
FIG. 4 shows another angle of view of the exploded view of the surge protection module 100.
Figure 5:
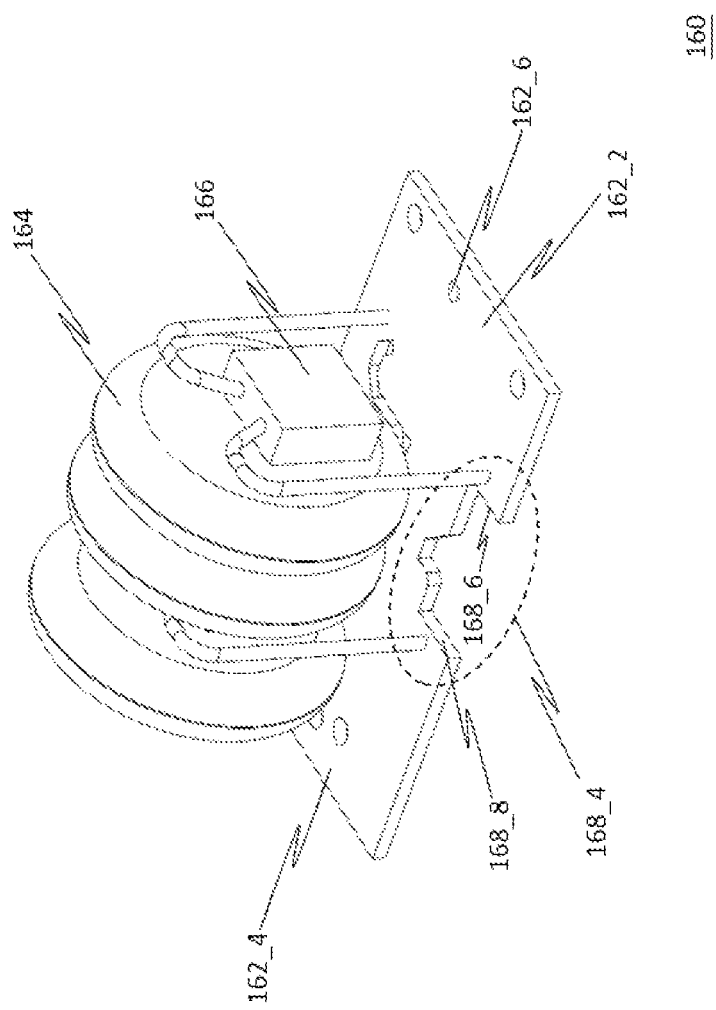
FIG. 5 shows one angle of view of the PCBA 160.
Figure 6:
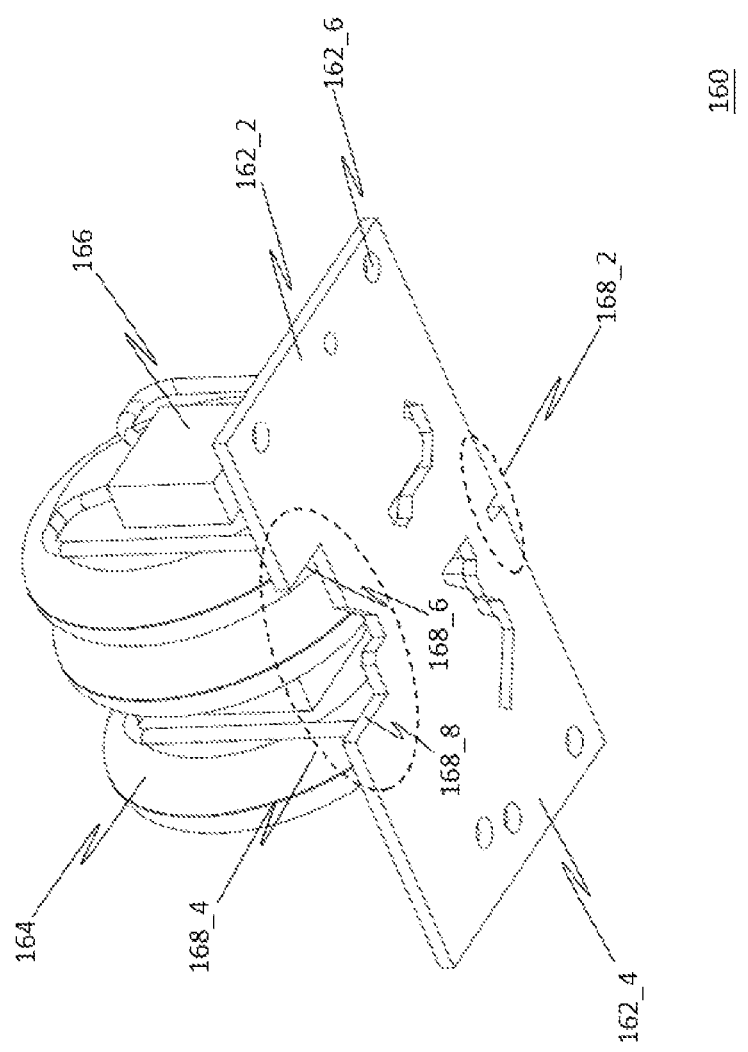
FIG. 6 shows another angle of view of the PCBA 160.
Figure 7:
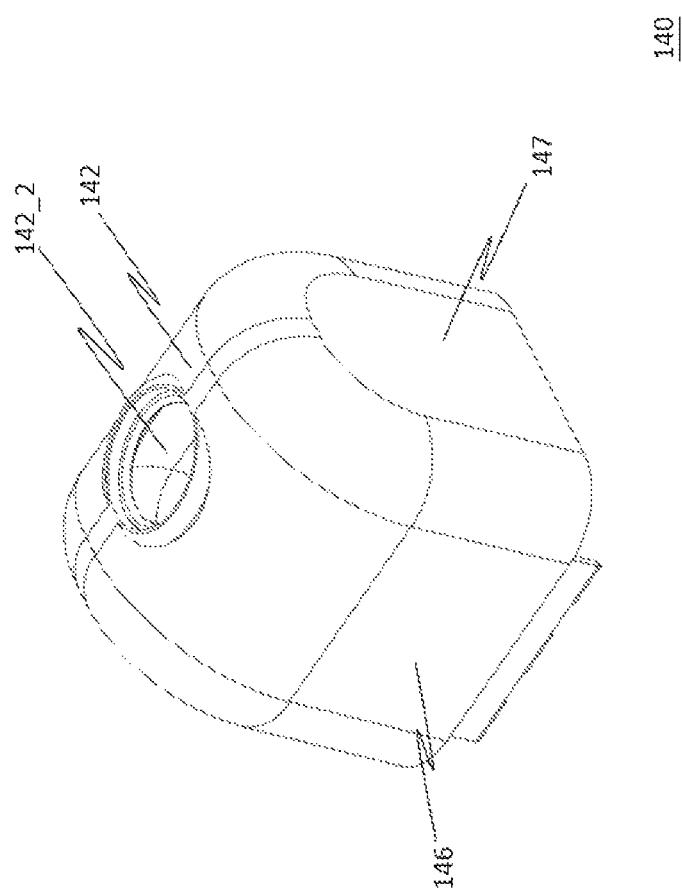
FIG. 7 shows one angle of view of the upper cover 140.
Figure 8:
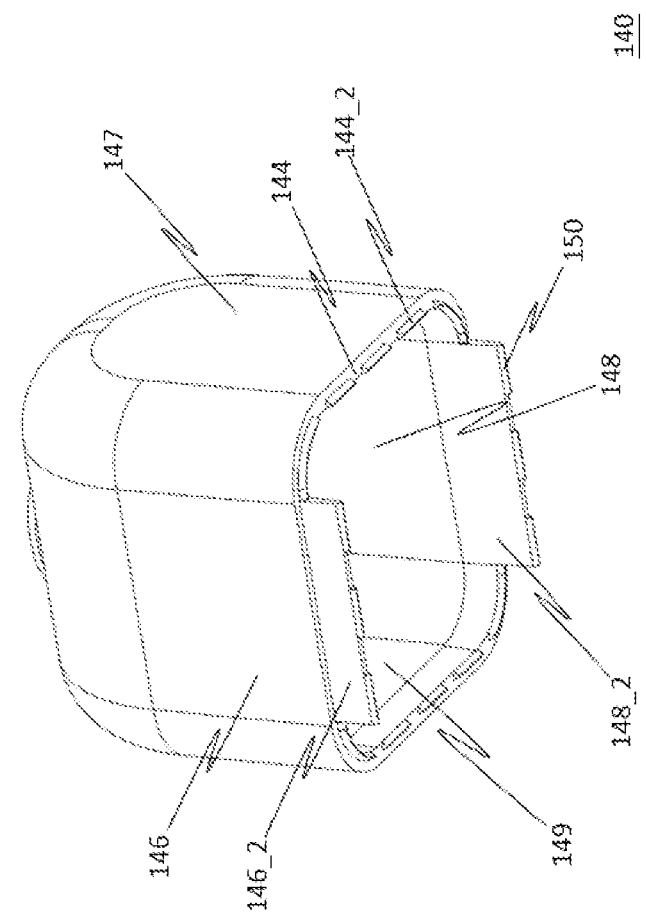
FIG. 8 shows another angle of view of the upper cover 140.
Figure 9:
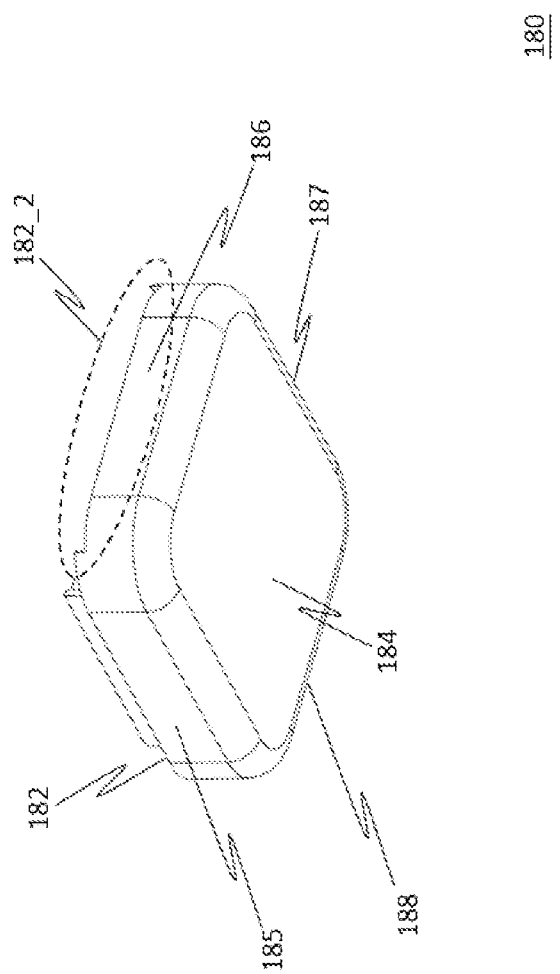
FIG. 9 shows one angle of view of the lower cover 180.
Figure 10:
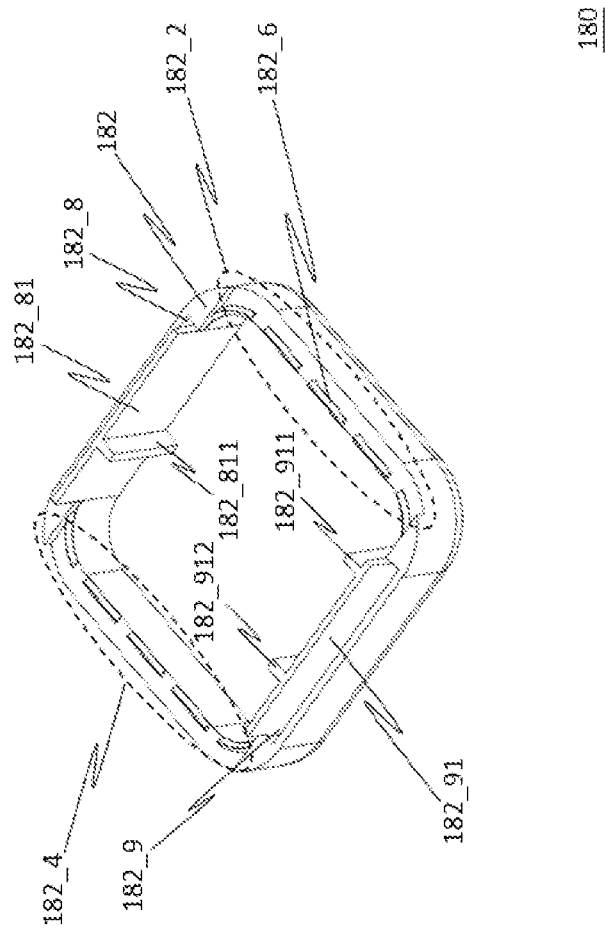
FIG. 10 shows another angle of view of the lower cover 180.

Referring to FIGS. 1-2, these two figures respectively show different angles of view of a surge protection module 100 according to an embodiment of the present invention. As shown in FIGS. 3-4, the surge protection module 100 comprises a sealing cover 120, an upper cover 140, a printed circuit board assembly (PCBA) 160, a lower cover 180 and a flame-retardant filler (not shown). The so-called printed circuit board assembly refers to a printed circuit board (PCB) assembled with electronic components.

Referring to FIGS. 3-4 and 7-10, the lower cover 180 is configured for connecting with the upper cover 140, and for forming an accommodation space together with the upper cover 140. In this embodiment, the upper cover 140 has four side walls, which are indicated by labels 146-149, respectively. The lower cover 180 also has four side walls, which are indicated by labels 185-188, respectively. In addition, each of two side walls of at least one of the upper cover 140 and the lower cover 180 has a notch, so that a first through hole and a second through hole are formed at the junction of the lower cover 180 and the upper cover 140. In this embodiment, only the side walls 186 and 188 of the lower cover 180 have notches 182_2 and 182_4 respectively, and after the lower cover 180 is connected to the upper cover 140, these two notches respectively form the aforementioned first through hole and second through hole. It is worth mentioning that, in other designs, each of the side walls 147 and 149 of the upper cover 140 may also have a notch to form the first through hole and the second through hole respectively with the notches 182_2 and 182_4 of the lower cover 180. Alternatively, it can also be designed that only two side walls of the upper cover 140 have notches, while none of the four side walls of the lower cover 180 has any notch.

In addition, in this embodiment, the top 142 of the upper cover 140 further has a filling hole 142_2 for filling the flame-retardant filler. The sealing cover 120 is suitable for sealing the filling hole 142_2. There are many ways for the sealing cover 120 to seal the filling hole 142_2. For example, the sealing cover 120 can use a buckle structure to buckle the edge of the filling hole 142_2. Alternatively, the inner edge of the filling hole 142_2 and the sealing cover 120 may be designed to have corresponding threads. Alternatively, the sealing cover 120 and the filling hole 142_2 can be connected by glue. It is worth mentioning that, in other designs, the filling hole 142_2 can also be located at other positions of the upper cover 140. Alternatively, the surge protection module 100 does not have the sealing cover 120, but the flame-retardant filler and glue are sequentially filled in the manufacturing process to further seal the filling hole 142_2. Certainly, the upper cover 140 may not have the filling hole 142_2, and other methods are used to fill the flame-retardant filler into the surge protection module 100.

Referring to FIGS. 3-6, the PCBA 160 has a plurality of copper traces (not shown), and is equipped with at least one surge protection device (as indicated by label 164) and at least one fuse (as indicated by label 166). Certainly, in other embodiments, the PCBA 160 may also be only equipped with at least one surge protection device. In addition, the PCBA 160 further has a plurality of welding structures (as indicated by label 162_6), and these welding structures 162_6 are distributed on the first end 162_2 and the second end 162_4 of the PCBA 160. In this embodiment, these welding structures 162_6 are conductive via holes, and there are six in number. The welding structures 162_6 are electrically coupled to the aforementioned surge protection devices 164 and the fuses 166 through the aforementioned copper traces. It is worth mentioning that these welding structures 162_6 can also be implemented by conductive pads, or be implemented by slots with conductive pads (details will be described later). Alternatively, these welding structures 162_6 can be implemented by any number of combinations of conductive via holes, conductive pads, and slots with conductive pads. Certainly, the number of welding structures 162_6 must vary with the actual design of the surge protection circuit.

Referring to FIGS. 3-10, the PCBA 160 is disposed in the aforementioned accommodation space. The first end 162_2 of the PCBA 160 passes through the first through hole formed by the notch 182_2 to expose the three welding structures 162_6 on the first end 162_2, while the second end 162_4 of the PCBA 160 passes through the second through hole formed by the notch 182_4 to expose the three welding structures 162_6 on the second end 162_4. In addition, in this embodiment, the PCBA 160 further has notches 168_2 and 168_4, the functions of these two notches will be described in detail later. As for the aforementioned flame-retardant filler, it is filled in the gap of the accommodation space. In this embodiment, the flame-retardant filler filled in the aforementioned gap comprises at least one of quartz sand and epoxy resin.

Referring to FIGS. 7-10, in this embodiment, the upper cover 140 and the lower cover 180 are made of plastic, and at least one of the bottom 144 of the upper cover 140 and the top 182 of the lower cover 180 forms a plurality of ultrasonic welding lines for ultrasonic welding. In this embodiment, the bottom 144 of the upper cover 140 forms a plurality of ultrasonic welding lines 144_2, and the top 182 of the lower cover 180 forms a plurality of ultrasonic welding lines 182_6. Certainly, the upper cover 140 and the lower cover 180 can also be made of other materials, and can be connected to each other by other connection manners, such as by buckle structures, glue, rails, rivet joint, etc. Since these connection manners are common in daily life, no further description will be given here.

In addition, in this embodiment, each of the two side walls of the upper cover 140 that are not used to form the first through hole and the second through hole (i.e., the side walls 146 and 148) has a positioning portion, as indicated by labels 146_2 and 148_2 respectively. Each of the two side walls of the lower cover 180 that are not used to form the first through hole and the second through hole (i.e., the side walls 185 and 187) has a positioning groove, as indicated by labels 182_9 and 182_8 respectively. The positioning grooves 182_9 and 182_8 are used to accommodate the positioning portions 146_2 and 148_2 respectively. In this embodiment, the positioning portions 146_2 and 148_2 of the upper cover 140 are also form a plurality of ultrasonic welding lines (as indicated by label 150). Certainly, the positioning portions 146_2 and 148_2 of the upper cover 140 may not have ultrasonic welding lines.

In addition, in this embodiment, the inner side wall of the positioning groove 182_8 extends a stop portion 182_81, and the stop portion 182_81 has a rib 182_811 to match the notch 168_2 of the PCBA 160. The inner side wall of the positioning groove 182_9 extends a stop portion 182_91, and the stop portion 182_91 has ribs 182_911 and 182_912 for abutting against two edges 168_6 and 168_8 of the notch 168_4 of the PCBA 160 respectively. Accordingly, the PCBA 160 can be further fixed by the ribs 182_811, 182_911 and 182_912. It is worth mentioning that the aforementioned positioning portions, positioning grooves, stop portions, ribs, and the notches of the PCBA 160 can be adopted or changed according to actual design requirements.

Figure 11:
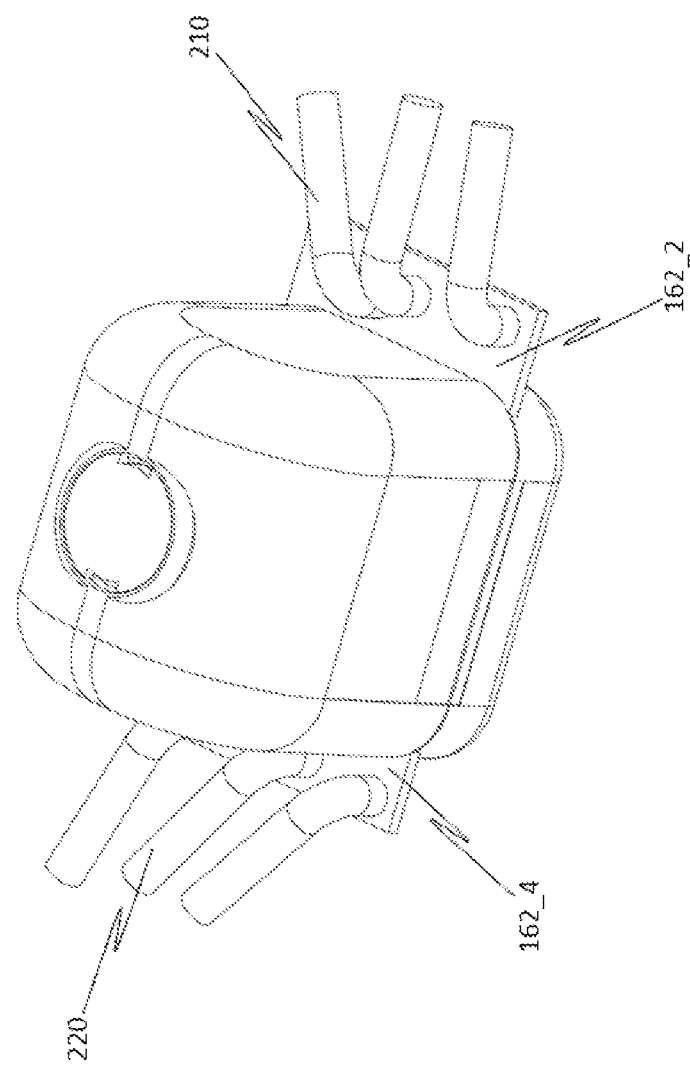
FIG. 11 is a partial schematic diagram of the surge protection module 100 with a plurality of electric wires welded thereto.
Figure 12:
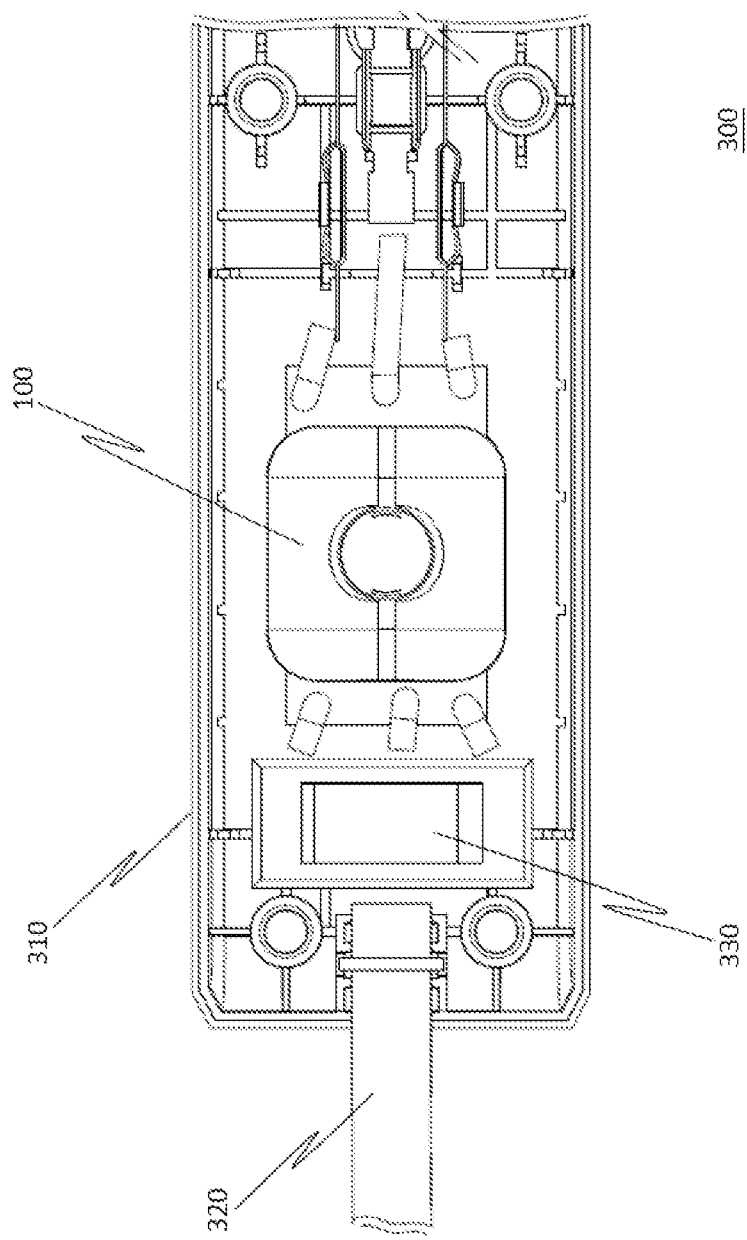
FIG. 12 shows an arrangement of the surge protection module 100 inside a power strip 300.

Referring to FIG. 11, which is a partial schematic diagram of the surge protection module 100 with a plurality of electric wires welded thereto. As shown in FIG. 11, the three welding structures 162_6 distributed on the first end 162_2 of the PCBA 160 are welded with electric wires (as indicated by label 210), and the three welding structures 162_6 distributed on the second end 162_4 of the PCBA 160 are also welded with electric wires (as indicated by label 220). Referring to FIG. 12, which shows an arrangement of the surge protection module 100 inside a power strip 300. As shown in FIG. 12, the surge protection module 100 is disposed inside the housing 310 of the power strip 300, and the surge protection module 100 is electrically coupled to the cable 320 of the power strip 300 through the rocker switch 330. In this way, the user can determine whether to transfer the power on the cable 320 to the electrodes of each socket (not shown) through the surge protection module 100 by switching the ON/OFF state of the rocker switch 330. Although FIG. 12 illustrates the internal configuration of the power strip, it is not intended to limit the present invention, those skilled in the art should know that the surge protection module 100 of the present invention can also be applied to other electronic devices.

Figure 13:
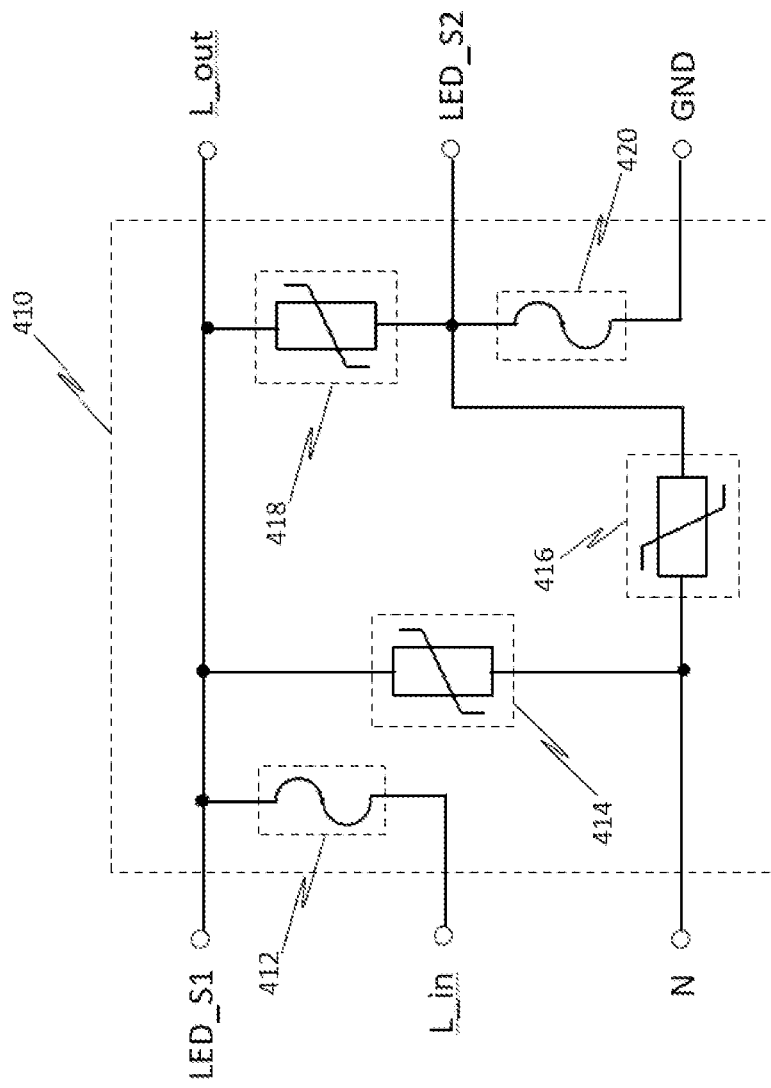
FIG. 13 shows one implementation of the surge protection circuit on the PCBA 160.

Referring to FIG. 13, which shows one implementation of the surge protection circuit on the PCBA 160. As shown in FIG. 13, the surge protection circuit 410 comprises MOVs 414, 416 and 418, and fuses 412 and 420. These five electronic components are electrically coupled to each other through the copper traces on the PCBA 160 in the manner shown in FIG. 13. In addition, these five electronic components are also electrically coupled to the three welding structures 162_6 on the second end 162_4 of the PCBA 160 through the aforementioned copper traces, so as to respectively receive the live line voltage L_in and the neutral line voltage N of the AC input, and provide the identification signal LED_S1 for identifying whether the AC input fails. In addition, these five electronic components are also electrically coupled to the three welding structures 162_6 on the first end 162_2 of the PCBA 160 through the aforementioned copper traces, so as to receive the ground signal GND and provide the output voltage L_out and the identification signal LED_S2. The identification signal LED_S2 is used to determine whether the ground signal GND fails. Certainly, the surge protection circuit can also adopt other circuit structures, and the number of welding structures 162_6 should be adjusted correspondingly according to different circuit structures.

Figure 14:
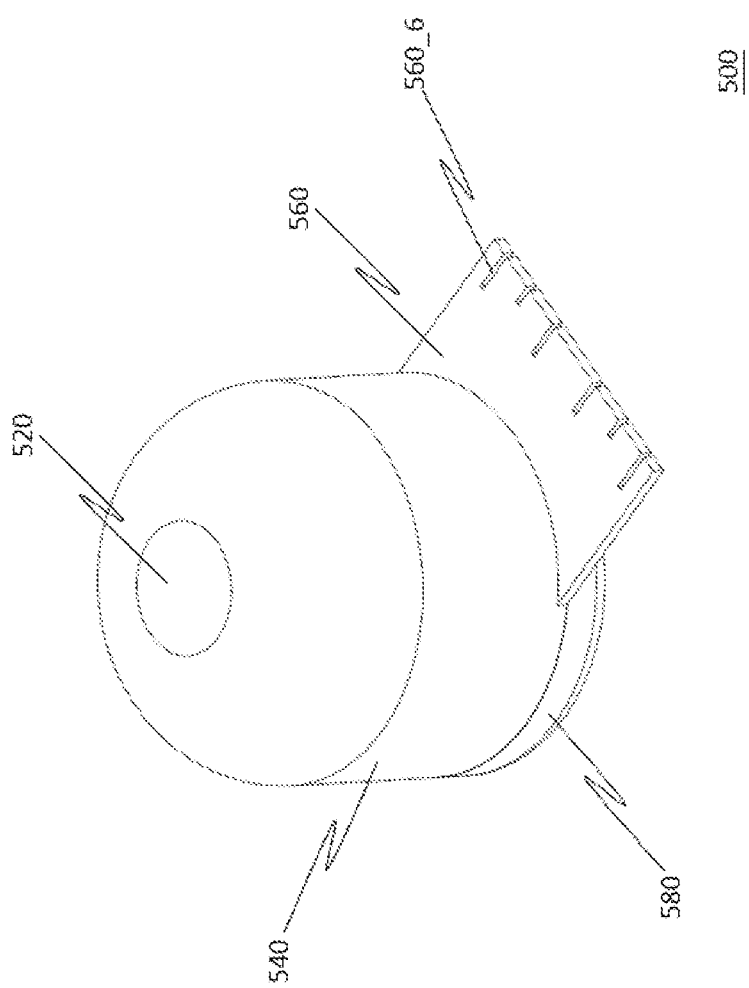
FIG. 14 shows one angle of view of a surge protection module 500 according to another embodiment of the present invention.
Figure 15:
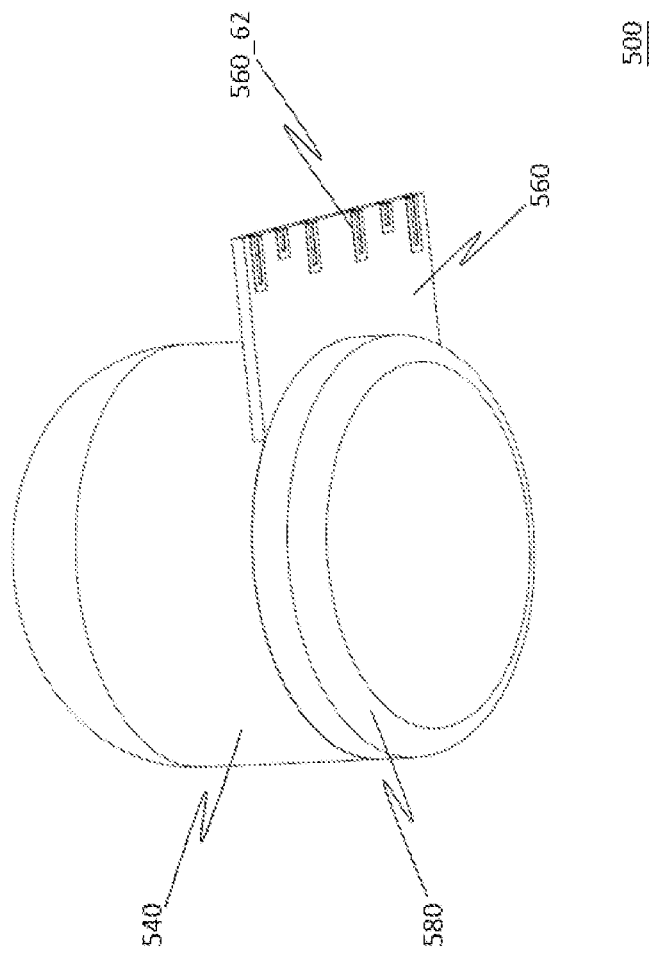
FIG. 15 shows another angle of view of the surge protection module 500.

Referring to FIGS. 14-15, these two figures respectively show different angles of view of a surge protection module 500 according to another embodiment of the present invention. As shown in FIGS. 14-15, the upper cover 540 and the lower cover 580 of the surge protection module 500 are both circular, so each of them has only one side wall. The side wall of at least one of the upper cover 540 and the lower cover 580 has a notch, so that a through hole is formed at the junction of the lower cover 580 and the upper cover 540. In addition, the PCBA 560 is disposed in an accommodation space formed by the upper cover 540 and the lower cover 580. The PCBA 560 also has a plurality of welding structures 560_6, these welding structures 560_6 are distributed on one end of the PCBA 560, and the end passes through the aforementioned through hole to expose the welding structures 560_6. For convenience of comparison with the surge protection module 100, the number of the welding structures 560_6 of the surge protection module 500 is also six. In addition, in this embodiment, these welding structures 560_6 are implemented by slots with conductive pads (as indicated by label 560_62).

Although in this embodiment, the conductive pads 560_62 are all disposed on the lower surface of the PCBA 560, in other embodiments the conductive pads 560_62 can also be all disposed on the upper surface of the PCBA 560, or distributed on the upper surface and the lower surface of the PCBA 560. In addition, in this embodiment, the surge protection module 500 further has a sealing cover 520 for sealing the filling hole at the top of the upper cover 540. Certainly, the gap of the aforementioned accommodation space formed by the upper cover 540 and the lower cover 580 is also filled with flame-retardant filler.

In addition, in this embodiment, the upper cover 540 and the lower cover 580 are made of plastic, and at least one of the bottom of the upper cover 540 and the top of the lower cover 580 forms at least one ultrasonic welding line for ultrasonic welding. In other words, it can be designed that only the bottom of the upper cover 540 forms at least one ultrasonic welding line, or that only the top of the lower cover 580 forms at least one ultrasonic welding line, or that each of the bottom of the upper cover 540 and the top of the lower cover 580 forms at least one ultrasonic welding line.

Although the surge protection module of the present invention may have different designs, it can be concluded from the descriptions of the above embodiments that the joint of the upper cover and the lower cover of the surge protection module of the present invention must form at least one through hole, and a part of the PCBA must pass through the said at least one through hole to expose the welding structures. In this way, the surge protection module of the present invention can be applied to various electronic devices, and can further achieve the standardization of the configuration of the surge protection module, which is more conducive to planned production.

In summary, since the interior of the surge protection module of the present invention is filled with flame-retardant filler, it can achieve the effect of fireproof. In addition, since the flame-retardant filler inside the surge protection module can also buffer (or even absorb) the impact caused by the explosion of the surge protection device, and the shell formed by the upper cover and the lower cover can also block the fragments of the surge protection device generated by the explosion in its interior, without letting the fragments fly around, achieving the explosion-proof effect. In this way, the electronic device adopting the surge protection module of the present invention will be safer. In addition, compared with the conventional technology, the electronic device adopting the surge protection module of the present invention only needs to conduct safety sampling tests for abnormal voltages (such as 240V) for the surge protection module during manufacture, instead of testing all electronic devices. Thus, the cost of safety sampling tests can be further reduced.

While the disclosure has been described by way of example and in terms of the preferred embodiments, it is to be understood that the disclosure is not limited to the disclosed embodiments. To the contrary, it is intterminaled to cover various modifications and similar arrangements (as would be apparent to those skilled in the art). Therefore, the scope of the appterminaled claims should be accorded the broadest interpretation so as to encompass all such modifications and similar arrangements.

What is claimed is:

1. A surge protection module, comprising:
    an upper cover;
    a lower cover, configured for connecting with the upper cover, and for forming an accommodation space together with the upper cover, wherein each of the upper cover and the lower cover has four side walls, and each of two side walls of at least one of the upper cover and the lower cover has a notch, so that a first through hole and a second through hole are formed at the junction of the lower cover and the upper cover;
    a printed circuit board assembly (PCBA), having a plurality of copper traces, and being equipped with at least one surge protection device, the PCBA further having a plurality of welding structures, the welding structures being electrically coupled to the surge protection devices through the copper traces, the PCBA being disposed in the accommodation space, wherein the welding structures are distributed on a first end and a second end of the PCBA, and the first end and the second end pass through the first through hole and the second through hole respectively to expose the welding structures; and
    a flame-retardant filler, being filled in a gap of the accommodation space.

2. The surge protection module as claimed in claim 1, wherein the upper cover and the lower cover are made of plastic, and at least one of a bottom of the upper cover and a top of the lower cover forms a plurality of ultrasonic welding lines for ultrasonic welding.

3. The surge protection module as claimed in claim 2, wherein each of the two side walls of the upper cover that are not used to form the first through hole and the second through hole has a positioning portion, each of the two side walls of the lower cover that are not used to form the first through hole and the second through hole has a positioning groove, and the positioning grooves are used to accommodate the positioning portions.

4. The surge protection module as claimed in claim 3, wherein the positioning portions of the upper cover also form a plurality of ultrasonic welding lines.

5. The surge protection module as claimed in claim 3, wherein the PCBA further has a first notch and a second notch, and an inner side wall of each positioning groove extends a stop portion, one of the stop portions has a first rib, the other stop portion has a second rib and a third rib, the first rib is used to match the first notch, and the second rib and the third rib are used to abut against two edges of the second notch.

6. The surge protection module as claimed in claim 1, wherein the upper cover further has a filling hole.

7. The surge protection module as claimed in claim 6, wherein the filling hole is located at a top of the upper cover.

8. The surge protection module as claimed in claim 6, wherein the surge protection module further comprises a sealing cover for sealing the filling hole.

9. The surge protection module as claimed in claim 1, wherein the fire-retardant filler comprises at least one of quartz sand and epoxy resin.

10. The surge protection module as claimed in claim 1, wherein the PCBA is further equipped with at least one fuse, and the welding structures are further electrically coupled to the fuses through the copper traces.

11. The surge protection module as claimed in claim 1, wherein at least one of the welding structures is a conductive via hole.

12. The surge protection module as claimed in claim 1, wherein at least one of the welding structures is a conductive pad.

13. The surge protection module as claimed in claim 1, wherein at least one of the welding structures is a slot with a conductive pad disposed on a surface of the PCBA.

* * * * *